(12) United States Patent
Engelmann et al.

(10) Patent No.: US 8,658,050 B2
(45) Date of Patent: Feb. 25, 2014

(54) METHOD TO TRANSFER LITHOGRAPHIC PATTERNS INTO INORGANIC SUBSTRATES

(75) Inventors: Sebastian Ulrich Engelmann, White Plains, NY (US); Martin Glodde, Mahwah, NJ (US); Michael A. Guillorn, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 13/191,985

(22) Filed: Jul. 27, 2011

(65) Prior Publication Data

US 2013/0026133 A1    Jan. 31, 2013

(51) Int. Cl.
*H01L 21/302* (2006.01)

(52) U.S. Cl.
USPC ............... 216/47; 216/48; 216/49; 216/51; 216/67; 216/74; 216/79; 438/710; 438/725; 438/948; 438/950; 430/313; 430/330

(58) Field of Classification Search
None
See application file for complete search history.

(56) References Cited

U.S. PATENT DOCUMENTS

| | | | |
|---|---|---|---|
| 4,732,841 A * | 3/1988 | Radigan | 430/311 |
| 6,136,729 A * | 10/2000 | Hopper et al. | 438/778 |
| 6,420,278 B1 * | 7/2002 | Hopper et al. | 438/778 |
| 6,818,381 B2 | 11/2004 | Khojasteh et al. | |
| 6,936,398 B2 | 8/2005 | Fedynyshyn | |
| 7,037,994 B2 | 5/2006 | Sugita et al. | |
| 7,244,549 B2 | 7/2007 | Iwasawa et al. | |
| 7,303,855 B2 * | 12/2007 | Hatakeyama et al. | 430/270.1 |
| 7,358,025 B2 | 4/2008 | Hatakeyama | |
| 7,375,172 B2 | 5/2008 | Huang et al. | |
| 7,491,658 B2 | 2/2009 | Nguyen et al. | |
| 7,521,377 B2 | 4/2009 | Gates et al. | |
| 7,915,180 B2 | 3/2011 | Gates et al. | |
| 2001/0055731 A1 * | 12/2001 | Irie | 430/313 |
| 2003/0148631 A1 * | 8/2003 | Kuo et al. | 438/782 |
| 2009/0174036 A1 | 7/2009 | Fuller et al. | |
| 2010/0021843 A1 | 1/2010 | Fedynyshyn et al. | |
| 2010/0081082 A1 | 4/2010 | Yoshimura et al. | |
| 2011/0042653 A1 | 2/2011 | Glodde et al. | |
| 2011/0042771 A1 | 2/2011 | Huang et al. | |

OTHER PUBLICATIONS

M.S.M. Saifullah, et al., "Sub-10 nm Electron Beam Nanolithography Using Spin-Coatable TiO2 Resists," Nanoletters 3, 1587 (2003).
J. Stowers, et al., "Directly Patterned Inorganic Hardmask for EUV Lithography," Proc. SPIE 7969, 796915 (2011).

(Continued)

*Primary Examiner* — Anita Alanko
(74) *Attorney, Agent, or Firm* — Vazken Alexanian; Michael J. Chang, LLC

(57) ABSTRACT

Techniques for minimizing or eliminating pattern deformation during lithographic pattern transfer to inorganic substrates are provided. In one aspect, a method for pattern transfer into an inorganic substrate is provided. The method includes the following steps. The inorganic substrate is provided. An organic planarizing layer is spin-coated on the inorganic substrate. The organic planarizing layer is baked. A hardmask is deposited onto the organic planarizing layer. A photoresist layer is spin-coated onto the hardmask. The photoresist layer is patterned. The hardmask is etched through the patterned photoresist layer using reactive ion etching (RIE). The organic planarizing layer is etched through the etched hardmask using RIE. A high-temperature anneal is performed in the absence of oxygen. The inorganic substrate is etched through the etched organic planarizing layer using reactive ion etching.

19 Claims, 8 Drawing Sheets

(56) References Cited

OTHER PUBLICATIONS

M. Glodde et al., "Systematic Studies on Reactive Ion Etch-Induced Deformations of Organic Underlayers," Proc. SPIE, 7972 797216 (2011).

Ishibashi et al., "Novel Spin-on Carbon Hard Mask with Hardening by Ion Implantation," Journal of Photopolymer Science and Technology, vol. 20, No. 3, pp. 365-372 (2007).

Ono et al., "Development of high-performance multi-layer resist process with hardening treatment," Proc. of SPIE, vol. 6519, 651920 (2007).

Seino et al., "Sub-45nm Resist Process Using Stacked-Mask Process," Proc. of SPIE, vol. 6923, 692320 (2008).

Yonekura et al., "Suppression of 193-nm photoresist deformation by H2 addition to fluorocarbon plasma in via hole etching," Thin Solid Films, vol. 515, pp. 5012-5018 (2007).

* cited by examiner

HIGH TEMPERATURE ANNEAL IN Ar, VACUUM OR OTHER INERT GASES.

METHOD TO TRANSFER LITHOGRAPHIC PATTERNS INTO INORGANIC SUBSTRATES

FIELD OF THE INVENTION

The present invention relates to lithographic pattern transfer, and more particularly, to techniques for minimizing or eliminating pattern deformation during such lithographic pattern transfer to inorganic substrates.

BACKGROUND OF THE INVENTION

Underlayers, such as organic planarizing layers or spin-on carbon layers, play a very important role in various integration schemes of chip manufacturing. One function of organic planarizing layers is to fill in pre-existing patterns on substrates, such as previously patterned vias, to enable lithographic patterning of the next level. More importantly, organic planarizing layer resistance to reactive ion etch (RIE) processes used to etch silicon-containing materials is essential for the successful pattern transfer from resists into the substrate.

Typically, a pattern is first transferred into the organic planarizing layer through a two-step RIE sequence, followed by the transfer into the substrate by a fluorine-containing RIE step that leaves the organic planarizing layer pattern mainly intact (FIG. 1). However, when the line/space patterns are scaled down to line widths below 35 nanometers (nm) (of course the actual onset depends on the organic planarizing layer material, the RIE tool and RIE chemistry used and the aspect ratio), it was found that this last RIE step induces severe pattern deformation ("wiggling") of the organic planarizing layer material, which ultimately prevents the successful pattern transfer into the substrate. For examples of wiggling of the organic planarizing layer material see M. Glodde et al., "Systematic Studies on Reactive Ion Etch-Induced Deformations of Organic Underlayers," Proc. SPIE, 7972 797216 (2011) (hereinafter "Glodde"), the contents of which are incorporated by reference herein.

It was previously found that employing a high temperature post-apply bake at 350 degrees Celsius (° C.) or above, helps improve performance. However, a high temperature post-apply bake step is not always possible. And in fact, this post-apply bake sometimes even has a negative impact on other material properties. For example, it was found that the adhesion of hydrogen silsesquioxane (HSQ) patterns generated through electron beam lithography to the organic planarizing layer is much better when the organic planarizing layer is baked at lower temperatures. This is a general trend, as HSQ adhesion is thought to depend on the presence of polymer-bound hydroxyl groups that disappear during high temperature processing due to cross-linking.

Another example are materials that have thermally unstable yet important additional components blended with, or bound to, the polymer backbone of the organic planarizing layer material, such as near infrared (NIR) dyes that are only thermally stable at temperatures up to from about 200° C. to about 220° C. See, for example, U.S. Application Publication Number 2011/0042771 filed by Huang et al., entitled "Near-Infrared Absorbing Film Compositions" and U.S. Application Publication Number 2011/0042653 filed by M. Glodde et al., entitled "Near-Infrared Absorbing Film Compositions," the contents of each of which are incorporated by reference herein. In these cases, the second post-apply bake at 350° C. or above would lead to severe degradation of beneficial material properties, eliminating this high temperature baking step as a viable option. Further, a high temperature post-apply bake can also change the optical constants, and thus the light absorbing/optical properties of the organic planarizing layer, in which case the material can no longer be used as a bottom anti-reflective coating (BARC).

In a previous approach to improve the pattern transfer, described in U.S. Patent Application Publication Number 2009/0174036 filed by Fuller et al., entitled "Plasma Curing of Patterning Materials for Aggressively Scaled Features," (hereinafter "U.S. Patent Application Publication Number 2009/0174036"), the contents of which are incorporated by reference herein, a UVCure plasma treatment in the RIE tool is inserted before and after the organic planarizing layer open etch step. However, it was shown that the results of this process are very sensitive to how the wafers are handled. For example, if the wafers are simply removed from the vacuum chamber for top-down scanning electron micrograph (SEM) inspection after the UVCure plasma treatment, this level of handling causes the lines to bend severely. This sensitivity could be part of the reason why this plasma curing method does not seem to work well when actually implemented in practice.

Thus, improved techniques for pattern transfer into inorganic substrates wherein pattern deformation of the organic planarizing layer material is minimized, or eliminated, would be desirable.

SUMMARY OF THE INVENTION

The present invention provides techniques for minimizing or eliminating pattern deformation during lithographic pattern transfer to inorganic substrates. In one aspect of the invention, a method for pattern transfer into an inorganic substrate is provided. The method includes the following steps. The inorganic substrate is provided. An organic planarizing layer is spin-coated onto the inorganic substrate. The organic planarizing layer is baked. A hardmask is deposited onto the organic planarizing layer. A photoresist layer is spin-coated onto the hardmask. The photoresist layer is patterned to form a patterned photoresist layer. The hardmask is etched through the patterned photoresist layer using reactive ion etching to form an etched hardmask. The organic planarizing layer is etched through the etched hardmask using reactive ion etching to form an etched organic planarizing layer, wherein the patterned photoresist layer is removed during the etching of the organic planarizing layer. A high-temperature anneal is performed in the absence of oxygen. The inorganic substrate is etched through the etched organic planarizing layer using reactive ion etching, wherein the etched hardmask is removed during the etching of the inorganic substrate.

In another aspect of the invention, another method for pattern transfer into an inorganic substrate is provided. The method includes the following steps. The inorganic substrate is provided. An organic planarizing layer is spin-coated onto the inorganic substrate. The organic planarizing layer is baked. An inorganic photoresist layer is spin-coated onto the organic planarizing layer. The inorganic photoresist layer is patterned to form a patterned inorganic photoresist layer. The organic planarizing layer is etched through the patterned inorganic photoresist layer using reactive ion etching to form an etched organic planarizing layer. A high-temperature anneal is performed in the absence of oxygen. The inorganic substrate is etched through the etched organic planarizing layer using reactive ion etching, wherein the patterned inorganic photoresist layer is removed during the etching of the inorganic substrate.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for pattern transfer into inorganic substrates wherein pattern deformation of the organic planarizing layer material as described above is minimized, or eliminated. FIGS. 1-6, for example, are diagrams illustrating an exemplary methodology for pattern transfer into an inorganic substrate that employs a novel high temperature bake step carried out in the presence of an inert gas, or in a vacuum which minimizes the deformation or "wiggling" that typically occurs with conventional pattern transfer processes.

Figure 1:
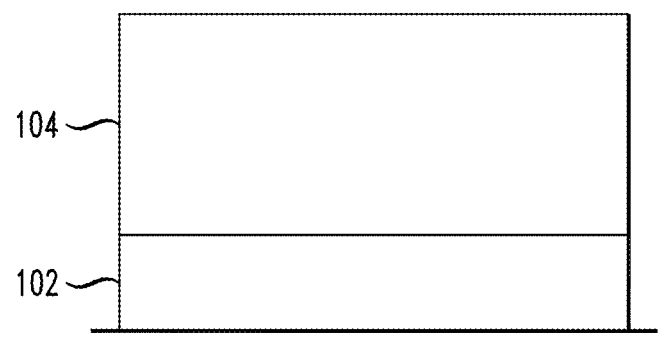
FIG. 1 is a cross-sectional diagram illustrating an inorganic substrate and an organic planarizing layer disposed on the substrate according to an embodiment of the present invention.
Figure 2:
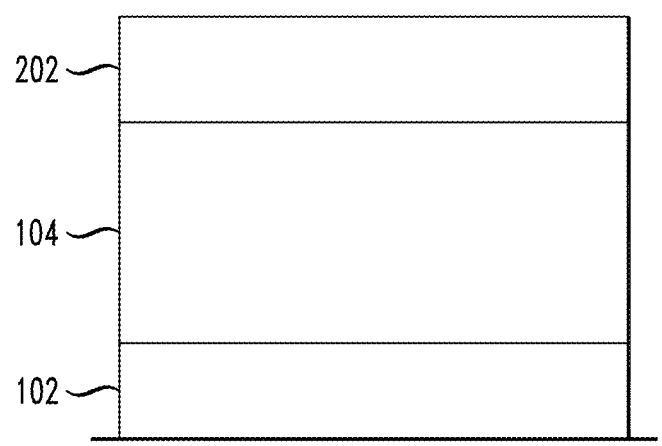
FIG. 2 is a cross-sectional diagram illustrating a hardmask having been deposited on the organic planarizing layer according to an embodiment of the present invention.

To begin the process, as shown in FIG. 1, an inorganic substrate 102 is provided. The substrate optionally has pre-existing patterns (e.g., vias) thereon. In order to permit further lithographic processing of the substrate, an organic planarizing layer 104 is spin-coated onto the substrate. The organic planarizing layer will serve to fill in the pre-existing patterns, such as vias, in the substrate. According to an exemplary embodiment, the organic planarizing layer 104 contains an aromatic cross-linkable polymer (e.g., naphthalene-based) in a solvent and is coated onto the substrate 102 to a thickness of from about 30 nanometers (nm) to about 300 nm. Spin-coating ensures that the organic planarizing layer sufficiently fills the gaps in the substrate.

Other suitable materials for use in the organic planarizing layer 104 include but are not limited to those materials described in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process." The contents of each of the foregoing patents are incorporated by reference herein. A post-apply bake is then performed to cross-link the organic planarizing layer and bake off the solvent. According to an exemplary embodiment, the post-apply bake is conducted at a temperature of up to about 250 degrees Celsius (° C.), e.g., from about 200° C. to about 250° C., The present techniques employ a trilayer patterning process (see, for example, Glodde), wherein a hardmask 202 (e.g., a low temperature oxide or silicon-containing anti-reflective coating (SiARC)) is deposited on organic planarizing layer 104. See FIG. 2. Organic planarizing layer 104/oxide or SiARC hardmask 202 have alternating selectivity towards fluorine- and oxygen-containing reactive ion etching (RIE) chemistry and therefore allow for highly selective pattern transfer from the photoresist pattern on top of the hardmask 202 (see below) into substrate 102 below the organic planarizing layer 104. Further, the organic planarizing layer/oxide or SiARC hardmask combination is essential for reflectivity control in high numerical aperture (NA) optical lithography applications.

Figure 3:
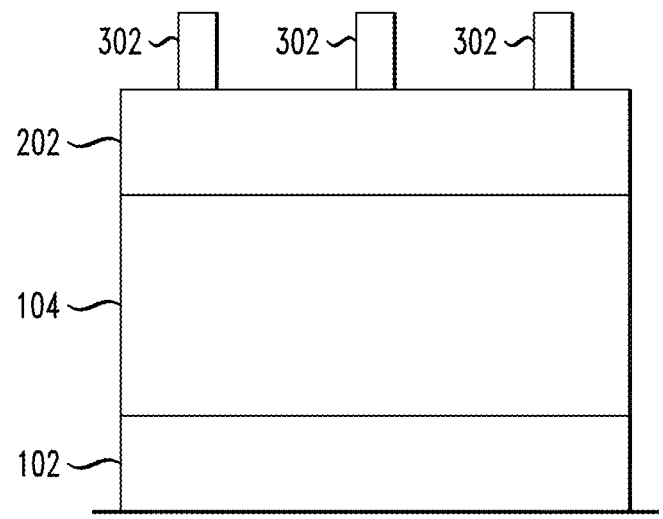
FIG. 3 is a cross-sectional diagram illustrating a photoresist having been deposited on the hardmask and patterned according to an embodiment of the present invention.

Next, as shown in FIG. 3, a photoresist layer is deposited onto the hardmask 202 and patterned to form patterned photoresist 302. The photoresist may be patterned using electron-beam (e-beam) lithography (EBL), nanoimprint lithography, extreme ultraviolet lithography (EUVL), or at 193 nm wavelength. Thus the term "photoresist," as used herein broadly encompasses any resist material(s) that can be patterned using EBL, EUVL and/or at 193 nm wavelength, or any other suitable materials. According to an exemplary embodiment, the photoresist (e.g., an aliphatic or aromatic resist) is spin-coated on anti-reflective coating 202.

Figure 4:
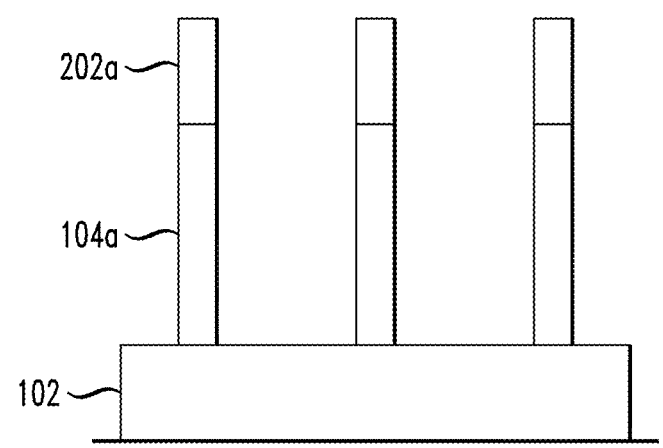
FIG. 4 is a diagram illustrating a two-step reactive ion etching (RIE) process through the patterned photoresist having been used to pattern the hardmask and organic planarizing layer according to an embodiment of the present invention.

A two-step RIE process through the patterned photoresist 302 is then used to pattern the hardmask 202 and organic planarizing layer 104. The result of the two-step RIE is shown in FIG. 4. As shown in FIG. 4, the hardmask 202 and organic planarizing layer 104 have been patterned resulting in patterned hardmask 202a and patterned organic planarizing layer 104a. The patterned photoresist 302 has also been removed in this step. The first RIE step is selective for etching the hardmask. According to an exemplary embodiment, the first RIE step is performed using a fluorine-containing, e.g., $CHF_3/CF_4$ chemistry. The second RIE step is selective for etching the organic planarizing layer. According to an exemplary embodiment, the second RIE step is performed using an oxygen-containing, e.g., $N_2/O_2$ chemistry.

As shown in FIG. 4, the patterned photoresist has also been removed at this stage of the process. Namely, the fluorine-containing, e.g., $CHF_3/CF_4$, etch partially etches the resist, and any residual resist is removed by the oxygen-containing, e.g., $N_2/O_2$, etch.

Alternatively, as will be described in detail below, if the pattern is generated using a resist that has high etch resistance against oxygen-containing etch chemistry, such as hydrogen silsesquioxane (HSQ), hafnium oxide ($HfO_2$)-based resists or others, a one-step RIE process can be applied to transfer the pattern into the organic planarizing layer. See FIGS. 7-11, described below.

Figure 5:
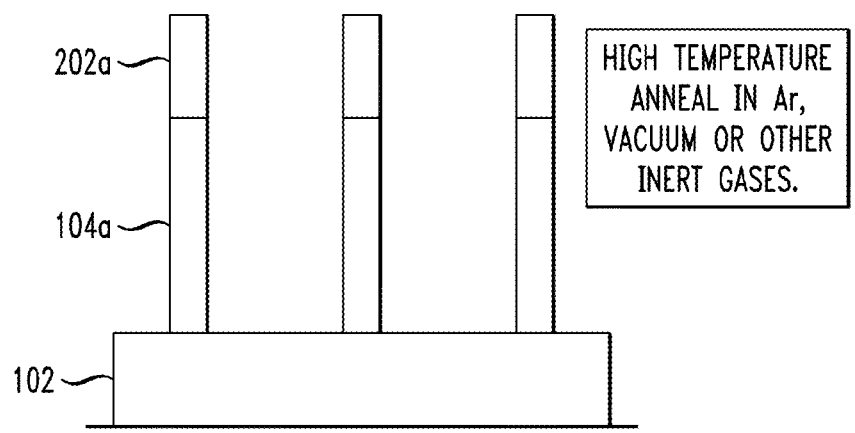
FIG. 5 is a cross-sectional diagram illustrating a high-temperature annealing of the structure carried out in a vacuum or under inert gas or gases being performed according to an embodiment of the present invention.

Following the two-step RIE, as shown in FIG. 5, a high-temperature anneal of the structure is performed. This annealing step is carried out in a vacuum or under inert gas or gases, e.g., in a dielectric chamber. Suitable inert gases include, but are not limited to, one or more of argon (Ar) and nitrogen ($N_2$). By way of example only, the anneal may be carried out at a temperature of from about 350° C. to about 500° C. Of course the upper temperature limit of this annealing step is dependent on the temperature at which the present materials degrade, and thus is in essence application specific. Carrying out this high-temperature annealing under the exclusion of oxygen/air is important, as air leads to much more severe pattern deformation than generated through the final RIE step (see, for example, FIG. 7, described below).

A UV curing process for minimizing deformation of the organic planarizing layer in the dielectric chamber can be optionally performed during the high-temperature anneal described immediately above. This UV curing process involves generation of highly intense photons (from about 50 nanometers (nm) to about 300 nm) within the dielectric chamber. Exemplary UV curing tools and dielectric chamber set-ups are described, for example, in U.S. Pat. No. 7,915,180 issued to Gates et al., entitled "SICOH Film Preparation Using Precursors with Built-In Porogen Functionality," U.S. Pat. No. 7,491,658 issued to Nguyen et al. entitled "Ultra Low K Plasma Enhanced Chemical Vapor Deposition Processes Using a Single Bifunctional Precursor Containing Both a SICOH Matrix Functionality and Organic Porogen Functionality" and U.S. Pat. No. 7,521,377 issued to Gates et al. entitled "SICOH Film Preparation Using Precursors with Built-In Porogen Functionality," the contents of each of which are incorporated by reference herein.

Alternatively, such a UV curing process can also be performed during the final RIE patterning of the substrate (see below) as is described, for example, in U.S. Patent Application Publication Number 2009/0174036, the contents of which are incorporated by reference herein. That process involves generation of highly intense photons (50 nm-300 nm) by a RIE tool in the RIE chamber and simultaneous suppression of ion damage by the same, and can be applied before and/or after organic planarizing layer open. The techniques described in U.S. Patent Application Publication Number 2009/0174036 may be incorporated into the present process during the final RIE patterning of the substrate, i.e., to further minimize the deformation of the organic planarizing layer.

Figure 6:
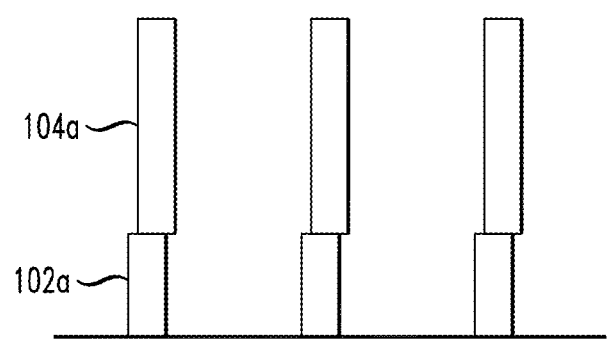
FIG. 6 is a cross-sectional diagram illustrating a final RIE having been performed to transfer the pattern into the substrate according to an embodiment of the present invention.

Finally, as shown in FIG. 6, a final RIE is performed to transfer the pattern into substrate 102, resulting in patterned substrate 102a. According to an exemplary embodiment, the final RIE is performed using a fluorine-containing, e.g., $CHF_3/CF_4$, or bromine chemistry, which also serves to remove any residual hardmask. The final RIE may be performed by a RIE tool in a RIE chamber. As described above, an optional UV curing process in accordance with the parameters described in U.S. Patent Application Publication Number 2009/0174036 may be performed at this stage to further minimize the deformation of the organic planarizing layer. It is noted that the techniques described in U.S. Patent Application Publication Number 2009/0174036 would not be applicable to UV curing during the high-temperature anneal (the step illustrated in FIG. 5 and described above) since a RIE tool cannot operate at the high temperatures needed for the anneal.

As shown in FIG. 6, this final RIE patterning of the substrate may cause some wiggling of the organic planarizing layer. This shifting experienced is however significantly less than that which would be experienced without the above-described high-temperature annealing process, which greatly enlarges the fabrication process window.

As highlighted above, if an inorganic photoresist is used in the present process that has high etch resistance against oxygen-containing etch chemistry, such as hydrogen silsesquioxane (HSQ), hafnium oxide ($HfO_2$)-based resists (see, for example, J. Stowers, et al., "Directly Patterned Inorganic Hardmask for EUV Lithography," *Proc. SPIE* 7969, 796915 (2011) (hereinafter "Stowers") the contents of which are incorporated by reference herein), titanium oxide ($TiO_2$)-based resists (see, for example, M. S. M. Saifullah, et al., "Sub-10 nm Electron Beam Nanolithography Using Spin-Coatable $TiO_2$ Resists," *Nanoletters* 3, 1587 (2003) the contents of which are incorporated by reference herein), or others, a one-step RIE process can be applied to transfer the pattern into the organic planarizing layer. This process is now described by way of reference to FIGS. 7-11.

Figure 7:
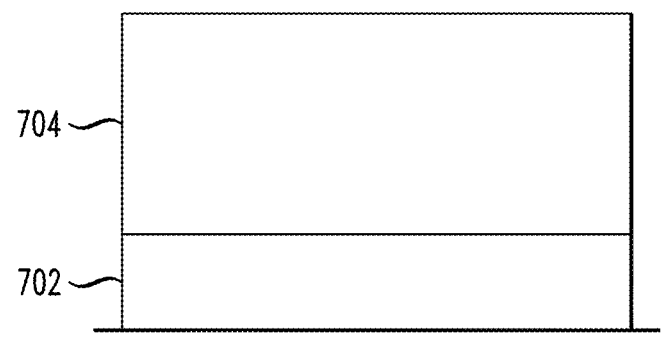
FIG. 7 is a cross-sectional diagram illustrating an inorganic substrate and an organic planarizing layer disposed on the substrate according to an embodiment of the present invention.
Figure 8:
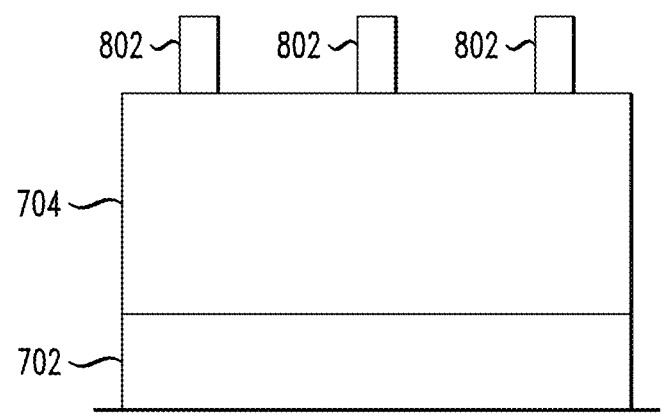
FIG. 8 is a cross-sectional diagram illustrating an inorganic resist having been deposited on the organic planarizing layer and patterned according to an embodiment of the present invention.

To begin the process, as shown in FIG. 7, an inorganic substrate 702 is provided. The substrate optionally has pre-existing patterns (e.g., vias) thereon. In order to permit further lithographic processing of the substrate, an organic planarizing layer 704 is spin-coated on the substrate. The organic planarizing layer will serve to fill in the pre-existing patterns, such as vias, in the substrate. As above, the organic planarizing layer 704 can contain an aromatic cross-linkable polymer (e.g., naphthalene-based) in a solvent and is coated on the substrate 702 to a thickness of from about 30 nm to about 300 nm. Spin-coating ensures that the organic planarizing layer sufficiently fills the gaps in the substrate. Other suitable materials for use in the organic planarizing layer were described in conjunction with the description of FIG. 1 above, and that description is incorporated here by reference.

A post-apply bake is then performed to cross-link the organic planarizing layer and bake off the solvent. According to an exemplary embodiment, the post-apply bake is conducted at a temperature of up to about 250° C.), e.g., from about 200° C. to about 250° C.

In contrast to the process described above, in this alternative embodiment a single negative tone patternable inorganic resist layer is employed (as compared to a hardmask/photoresist combination). The result is that a single (rather than two-step) RIE process can be used to pattern the organic planarizing layer. Namely, an inorganic photoresist layer that has high etch resistance against oxygen-containing etch chemistry is spin-coated on the organic planarizing layer 704. The inorganic photoresist layer can then be patterned using conventional techniques and cross-linked during the exposure (see, for example, Stowers) resulting in patterned inorganic photoresist layer 802. See FIG. 8. Suitable inorganic photoresist materials include, but are not limited to, hydrogen silsesquioxane (HSQ), hafnium oxide ($HfO_2$)-based resists, titanium oxide ($TiO_2$)-based resists or others. The inorganic photoresist layer can be patterned using e-beam lithography. Optionally, a separate high temperature anneal may be carried out at this point in the process to further cross-link the patterned inorganic photoresist layer 802. By way of example only, this annealing step is carried out in a vacuum or under inert gas or gases, e.g., in a dielectric chamber. Suitable inert gases include, but are not limited to, one or more of Ar and $N_2$. By way of example only, the anneal may be carried out at a temperature of from about 350° C. to about 500° C.

Figure 9:
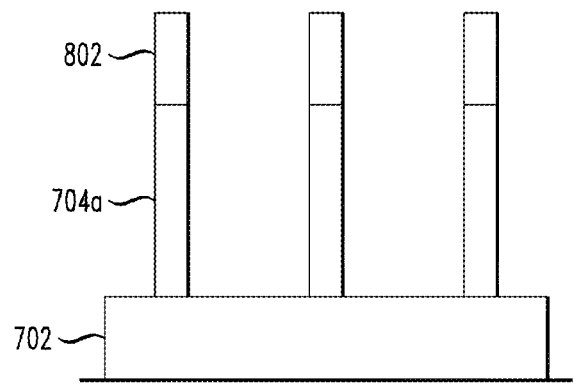
FIG. 9 is a cross-sectional diagram illustrating a one-step RIE process through the patterned inorganic resist having been used to pattern the organic planarizing layer according to an embodiment of the present invention.

A single RIE step through the patterned inorganic photoresist layer 802 is then used to pattern the organic planarizing layer 704. The result of this RIE step is shown in FIG. 9. As shown in FIG. 9, the organic planarizing layer 704 has been patterned resulting in patterned organic planarizing layer 704a. According to an exemplary embodiment, the RIE employed is selective for etching the organic planarizing layer vis-à-vis the patterned inorganic photoresist 802. According to an exemplary embodiment, the RIE step is performed using an oxygen-containing, e.g., $N_2/O_2$ chemistry.

Figure 10:
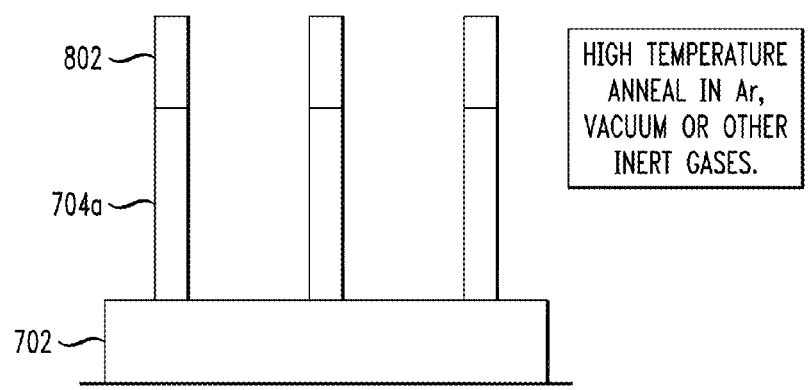
FIG. 10 is a cross-sectional diagram illustrating a high-temperature annealing of the structure carried out in a vacuum or under inert gas or gases being performed according to an embodiment of the present invention.

Following the RIE step, as shown in FIG. 10, a high-temperature anneal of the structure is performed. This annealing step is carried out in a vacuum or under inert gas or gases, e.g., in a dielectric chamber. Suitable inert gases include, but are not limited to, one or more of Ar and $N_2$. By way of example only, the anneal may be carried out at a temperature of from about 350° C. to about 500° C. Of course the upper temperature limit of this annealing step is dependent on the temperature at which the present materials degrade, and thus is in essence application specific. Carrying out this high-temperature annealing under the exclusion of oxygen/air is important, as air leads to much more severe pattern deformation than generated through the final RIE step.

As highlighted above, optionally a UV curing process for minimizing deformation of the organic planarizing layer in the dielectric chamber can be performed during the high-temperature anneal. This process involves generation of highly intense photon generation (from about 50 nm to about 300 nm) generated within the dielectric chamber (see above). Alternatively, such a UV curing process can also be performed during the final RIE patterning of the substrate (see below), as described, for example, in U.S. Patent Application Publication Number 2009/0174036, i.e., to further minimize the deformation of the organic planarizing layer.

Figure 11:
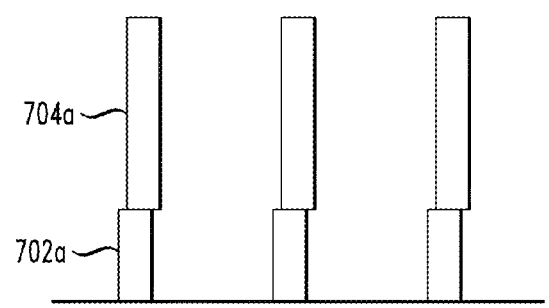
FIG. 11 is a cross-sectional diagram illustrating a final RIE having been performed to transfer the pattern into the substrate according to an embodiment of the present invention.

Finally, as shown in FIG. 11, a final RIE is performed to transfer the pattern into substrate 702, resulting in patterned substrate 702a. According to an exemplary embodiment, the final RIE is performed using a fluorine-containing gas, e.g., $CHF_3/CF_4$, a chlorine-containing gas, e.g., $Cl_2$, a bromine-containing gas, e.g., HBr, a boron-containing gas, e.g., $BCl_3$, chemistry, Ar gas, any $C_xH_yF_z$ gas (wherein $0 \leq x \leq 5$, $0 \leq y \leq 4$ and $0 \leq z \leq 8$), or a combination containing at least one of the foregoing gases. The residual inorganic resist layer is removed during this final RIE.

As shown in FIG. 11, this final RIE patterning of the substrate may cause some wiggling of the organic planarizing layer. This shifting experienced is however significantly less than that which would be experienced without the above-described high-temperature annealing process, which greatly enlarges the fabrication process window.

Figure 12:
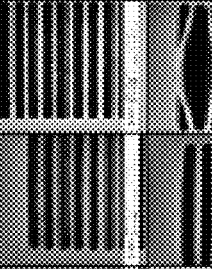
FIG. 12 is an image showing two wafer samples both of which were processed identically until the organic planarizing layer open step according to an embodiment of the present invention.

The present techniques are further described by reference to the following non-limiting examples. FIG. 12 is an image showing two wafer samples (Wafer 8 and Wafer 9) both of which were processed identically until the organic planarizing layer (OPL) open (first and third row). Subsequently, Wafer 8 was baked in air at 350° C. and Wafer 9 was baked in Ar at 350° C. Only when this annealing step occurs under exclusion of air (bottom row in FIG. 12), then line patterns stay intact.

Figure 13:
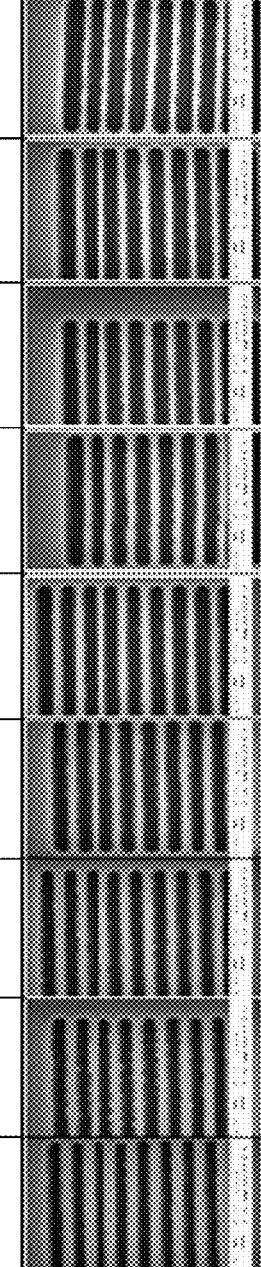
FIG. 13 is an image showing two wafer samples after final RIE, wherein one wafer has undergone the present high temperature annealing process and the other has not according to an embodiment of the present invention.
Figure 14:
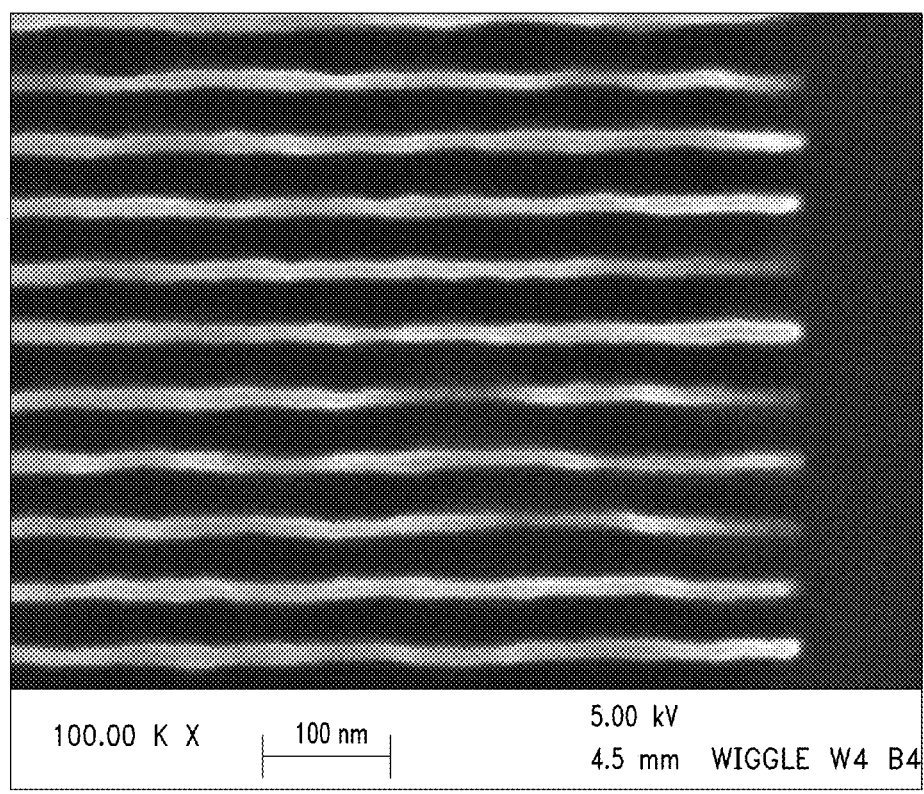
FIG. 14 is an image showing overexposed lines at P50 with an approximate line width of 15 nanometers (nm) after the final etch step according to an embodiment of the present invention.

The present techniques also make these organic planarizing layer lines much less prone to RIE-induced deformation during the last etch step, where the pattern is transferred into the inorganic substrate. See for example FIG. 13. FIG. 13 is an image showing two wafer samples (Wafer 9 and Wafer 10) after the final RIE, wherein Wafer 9 has undergone the present high temperature annealing process at 350° C. in the presence of inert (Ar) gas and Wafer 10 has not. No pattern deformation occurs on the wafer that went through the additional annealing step under air exclusion (top row). In contrast to the UV Curing process described in U.S. Patent Application Publication Number 2009/0174036, the integrity of the lines is not affected by removing the wafers from the RIE tool for inspection, as shown in FIG. 12 and FIG. 13. This method therefore allows for use of a comparably low post-apply bake temperature (less than or equal to about 250° C.), leaving other beneficial material properties like HSQ adhesion and NIR absorption intact at that stage, and at the same time drastically reduces or eliminates the pattern deformation/wiggling during the last etch step. Using the combination of post-apply bake 250° C. and anneal 350° C./Ar with additional UV curing after e-beam patterning of the HSQ resist and additional anneal and UV curing after the organic planarizing layer open etch nearly straight lines of about 15 nanometers (nm) at P50 (i.e., pitch 50, the lines have a distance of 50 nm from each other) were achieved. See FIG. 14. FIG. 14 is an image showing overexposed lines at P50 with an approximate line width of 15 nm after the final etch step.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for pattern transfer into an inorganic substrate, comprising the steps of:
   providing the inorganic substrate;
   spin-coating an organic planarizing layer onto the inorganic substrate;
   baking the organic planarizing layer;
   depositing a hardmask onto the organic planarizing layer;
   spin-coating a photoresist layer onto the hardmask;
   patterning the photoresist layer to form a patterned photoresist layer;
   etching the hardmask through the patterned photoresist layer using reactive ion etching to form an etched hardmask;
   etching the organic planarizing layer through the etched hardmask using reactive ion etching to form an etched organic planarizing layer, wherein the patterned photoresist layer is removed during the etching of the organic planarizing layer;
   performing a high-temperature anneal in the absence of oxygen at a temperature of from about 350° C. to about 500° C.; and
   etching the inorganic substrate through the etched organic planarizing layer using reactive ion etching, wherein the etched hardmask is removed during the etching of the inorganic substrate,
   and wherein the high-temperature anneal is performed after the organic planarizing layer has been etched through the etched hardmask but prior to the inorganic substrate being etched through the etched organic planarizing layer.

2. The method of claim 1, wherein the organic planarizing layer comprises an aromatic cross-linkable polymer.

3. The method of claim 1, wherein the organic planarizing layer is baked at a temperature of less than about 250° C.

4. The method of claim 1, wherein the organic planarizing layer is baked at a temperature of from about 200° C. to about 250° C.

5. The method of claim 1, wherein the hardmask comprises an oxide material.

6. The method of claim 1, wherein the hardmask comprises a silicon-containing anti-reflective coating.

7. The method of claim 1, wherein the photoresist layer comprises an aliphatic photoresist.

8. The method of claim 1, wherein the photoresist layer is patterned using electron-beam lithography, extreme ultraviolet lithography or at 193 nm wavelength.

9. The method of claim 1, wherein the hardmask and organic planarizing layer are etched through the patterned photoresist layer using a two-step reactive ion etching process, the method comprising the steps of:
etching the hardmask through the patterned photoresist layer using a first reactive ion etching step selective for the hardmask; and
etching the organic planarizing layer through the patterned photoresist layer and the etched hardmask using a second reactive ion etching step selective for the organic planarizing layer.

10. The method of claim 9, wherein the first reactive ion etching step is performed using a fluorine-containing chemistry, and wherein the second reactive ion etching step is performed using an oxygen-containing chemistry.

11. The method of claim 1, wherein the high-temperature anneal is carried out in a vacuum or under one or more inert gases.

12. The method of claim 11, wherein the inert gases comprise one or more of argon and nitrogen.

13. The method of claim 1, wherein the etching of the inorganic substrate is performed using a fluorine-containing or bromine chemistry.

14. The method of claim 1, further comprising the step of:
performing a UV cure during the high-temperature anneal.

15. A method for pattern transfer into an inorganic substrate, comprising the steps of:
providing the inorganic substrate;
spin-coating an organic planarizing layer onto the inorganic substrate;
baking the organic planarizing layer;
spin-coating an inorganic photoresist layer onto the organic planarizing layer;
patterning the inorganic photoresist layer to form a patterned inorganic photoresist layer;
etching the organic planarizing layer through the patterned inorganic photoresist layer using reactive ion etching to form an etched organic planarizing layer;
performing a high-temperature anneal in the absence of oxygen at a temperature of from about 350° C. to about 500° C.; and
etching the inorganic substrate through the etched organic planarizing layer using reactive ion etching, wherein the patterned inorganic photoresist layer is removed during the etching of the inorganic substrate,
and wherein the high-temperature anneal is performed after the organic planarizing layer has been etched through the patterned inorganic photoresist layer but prior to the inorganic substrate being etched through the etched organic planarizing layer.

16. The method of claim 15, wherein the inorganic resist layer comprises hydrogen silsesquioxane, hafnium oxide or titanium oxide.

17. The method of claim 15, wherein the high-temperature anneal is carried out in a vacuum or under one or more inert gases.

18. The method of claim 17, wherein the inert gases comprise one or more of argon and nitrogen.

19. The method of claim 15, further comprising the step of:
performing a high-temperature anneal in the absence of oxygen at a temperature of from about 350° C. to about 500° C. to cross-link the patterned inorganic photoresist layer.

* * * * *